(12) United States Patent
Kim et al.

(10) Patent No.: US 10,811,482 B2
(45) Date of Patent: Oct. 20, 2020

(54) DISPLAY DEVICE INCLUDING A DISPLAY MODULE WITH CONNECTING PINS

(71) Applicant: SAMSUNG DISPLAY CO., LTD., Yongin-si, Gyeonggi-do (KR)

(72) Inventors: Kang-Min Kim, Hwaseong-si (KR); Sooyon Moun, Yongin-si (KR); Namheon Kim, Seongnam-si (KR); Hasook Kim, Hwaseong-si (KR); Joohyung Lee, Yongin-si (KR)

(73) Assignee: SAMSUMG DISPLAY CO., LTD., Yongin-si, Gyeonggi-Do (KR)

( * ) Notice: Subject to any disclaimer, the term of this patent is extended or adjusted under 35 U.S.C. 154(b) by 54 days.

(21) Appl. No.: 15/796,408

(22) Filed: Oct. 27, 2017

(65) Prior Publication Data

US 2018/0122889 A1    May 3, 2018

(30) Foreign Application Priority Data

Nov. 1, 2016  (KR) .................. 10-2016-0144692

(51) Int. Cl.

| | | |
|---|---|---|
| *H01L 27/32* | (2006.01) | |
| *G09G 3/3225* | (2016.01) | |
| *G06F 3/041* | (2006.01) | |
| *H01L 51/00* | (2006.01) | |
| *H01L 51/52* | (2006.01) | |
| *H04B 1/3827* | (2015.01) | |
| *G06F 3/044* | (2006.01) | |

(52) U.S. Cl.
CPC ........ *H01L 27/3276* (2013.01); *G06F 3/0412* (2013.01); *G06F 3/0416* (2013.01); *G09G 3/3225* (2013.01); *H01L 27/323* (2013.01); *H01L 51/0097* (2013.01); *H01L 51/5253* (2013.01); *G06F 3/044* (2013.01); *G09G 2354/00* (2013.01); *H01L 27/3244* (2013.01); *H01L 2251/5338* (2013.01); *H04B 1/3827* (2013.01)

(58) Field of Classification Search
CPC . H01L 27/3276; H01L 27/323; G06F 3/0412; G09G 3/3225
USPC .................................................. 257/40, 773
See application file for complete search history.

(56) References Cited

U.S. PATENT DOCUMENTS

| | | | |
|---|---|---|---|
| 7,489,382 B2 | 2/2009 | Chen | |
| 7,544,897 B2 * | 6/2009 | Kobayashi | .......... G02F 1/13452 |
| | | | 174/254 |
| 9,214,507 B2 | 12/2015 | Mathew et al. | |
| 9,286,826 B2 | 3/2016 | Wright et al. | |
| 2008/0001241 A1 * | 1/2008 | Tuckerman | ......... B81C 1/00301 |
| | | | 257/434 |

(Continued)

FOREIGN PATENT DOCUMENTS

| | | |
|---|---|---|
| JP | 05-041397 | 2/1993 |
| KR | 10-1484852 | 1/2015 |
| KR | 10-1570014 | 11/2015 |

*Primary Examiner* — Robert T Huber
(74) *Attorney, Agent, or Firm* — F. Chau & Associates, LLC

(57) ABSTRACT

A display device includes a first circuit substrate and an overlapping second circuit. At least one connection pin is disposed in an opening in a base substrate which is disposed between the first circuit substrate and the second circuit substrate and the at least one connection pin is configured to connect the first circuit substrate to the second circuit substrate through the opening in the base substrate.

19 Claims, 9 Drawing Sheets

(56) References Cited

U.S. PATENT DOCUMENTS

2010/0052160 A1   3/2010  Sun et al.
2015/0348873 A1* 12/2015  Katkar .................. H01L 23/481
                                                257/774
2018/0084643 A1*  3/2018  Baxi .................... H05K 1/0283

* cited by examiner

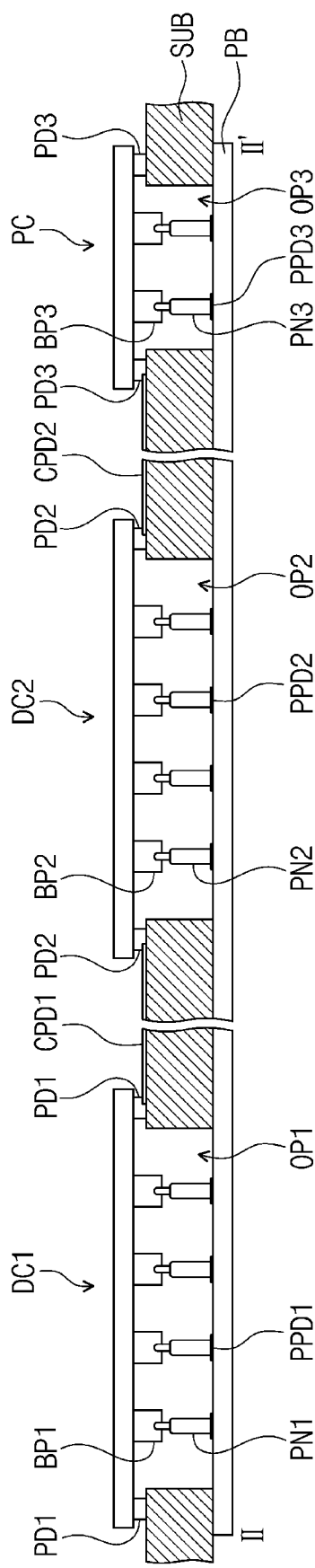
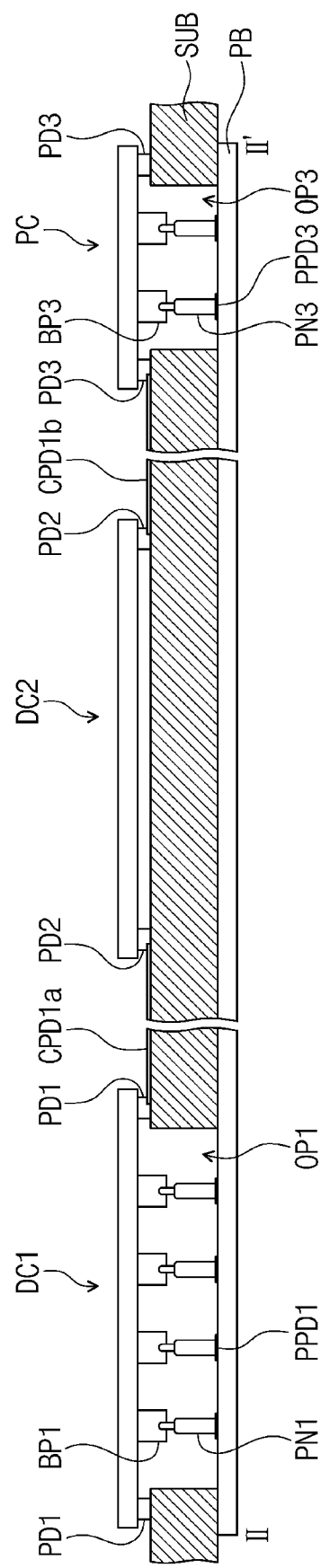
FIG. 10A
FIG. 10B

DISPLAY DEVICE INCLUDING A DISPLAY MODULE WITH CONNECTING PINS

CROSS-REFERENCE TO RELATED APPLICATION

This application claims priority to Korean Patent Application No. 10-2016-0144692, filed on Nov. 1, 2016, and all the benefits accruing therefrom under 35 U.S.C. § 119, the entire content of which are herein incorporated by reference.

TECHNICAL FIELD

The present disclosure relates to a display device and, more particularly, to a display device including a display module.

DISCUSSION OF THE RELATED ART

Various display devices used in multimedia devices such as televisions, computer monitors, smartphones and other portable phones, tablet computers, satellite navigation systems, and portable game consoles have been developed. While such devices may utilize a variety of input units such as keyboards, mice, buttons, etc., display devices may incorporate input units such as touch sensing members. Display devices with incorporated touch sensing members may be referred to herein as "touchscreens."

Traditionally, display devices have included a display area on which an image is displayed, and a non-display area surrounding the display area. No image is displayed in the non-display area and this region is often covered by a bezel. Recently, display devices having reduced non-display areas, and therefore, reduced bezel sizes, have been developed to widen display areas in which images are displayed.

SUMMARY

A display device includes a base substrate having a display area and a non-display area adjacent to the display area. The non-display area has an opening disposed therein. A circuit member is disposed on the base substrate within the display area and the non-display area. A display element is disposed on the circuit member and the display element overlaps the display area. A sealing member is disposed over the display element. A first circuit substrate is disposed on the base substrate and overlaps with the non-display area. The first circuit substrate covers the opening. The first circuit substrate is connected to the circuit member. A second circuit substrate is disposed under the base substrate and overlaps with the first circuit substrate. The second circuit substrate covers the opening. At least one connection pin is disposed in the opening and is configured to connect the first circuit substrate to the second circuit substrate.

A display device includes a bottom substrate having a hole. A top substrate is disposed over the bottom substrate and comprises a display area configured to display an image. The display area is configured to display an image. A base substrate is disposed below the bottom substrate. The base substrate includes a plurality of pins for delivering signals to drive the display area and the plurality of pins are disposed within the hole of the bottom substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 10A is a cross-sectional view taken along a line II-II' of FIG. 9 according to an exemplary embodiment of the present disclosure; and FIG. 10B is a cross-sectional view taken along the line II-II' of FIG. 9 according to an exemplary embodiment of the present disclosure.

DETAILED DESCRIPTION OF THE DRAWINGS

Figure 1:
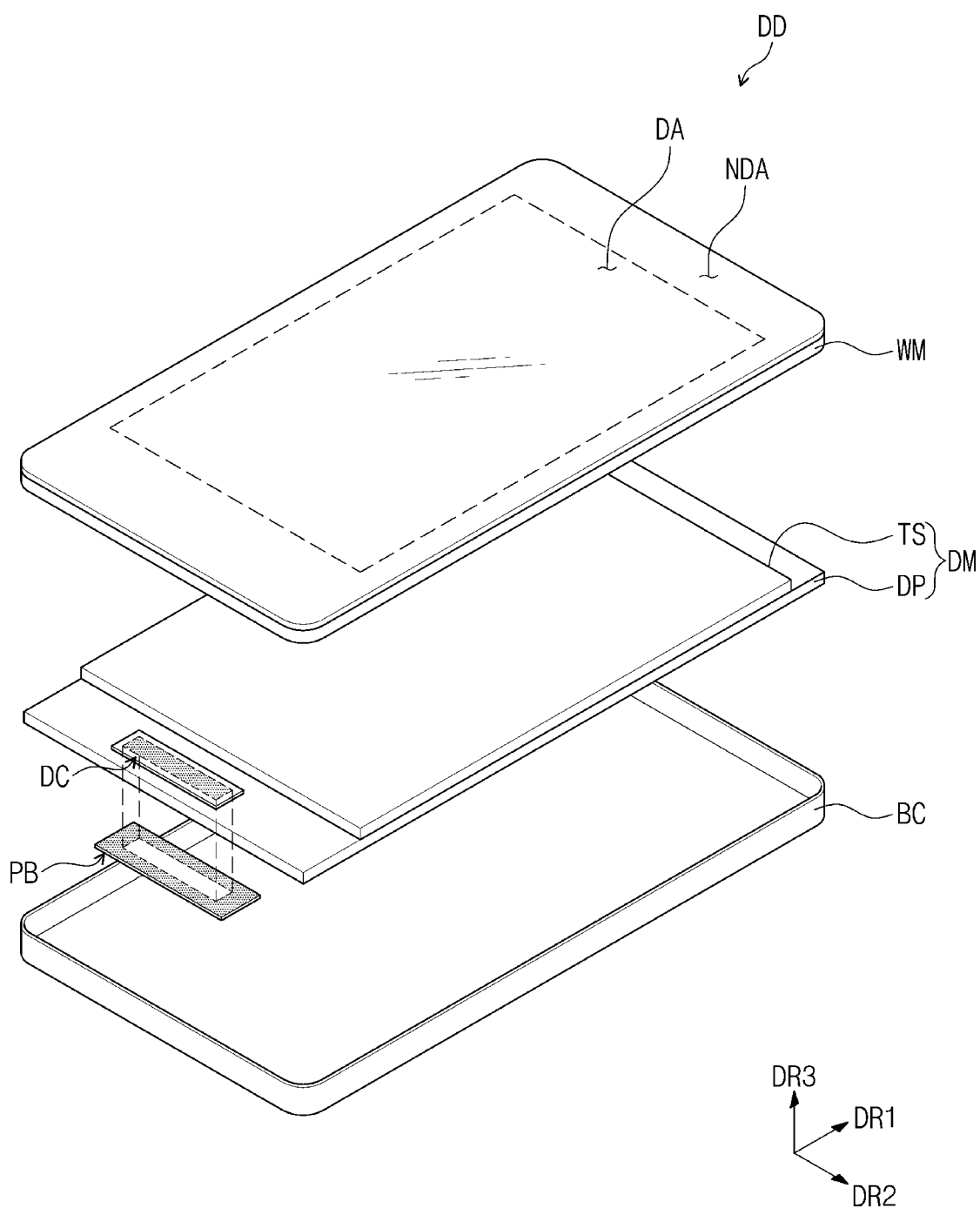
FIG. 1 is an exploded perspective view illustrating a display device according to an exemplary embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals may refer to like elements throughout the specification and the drawings.

Figure 2:
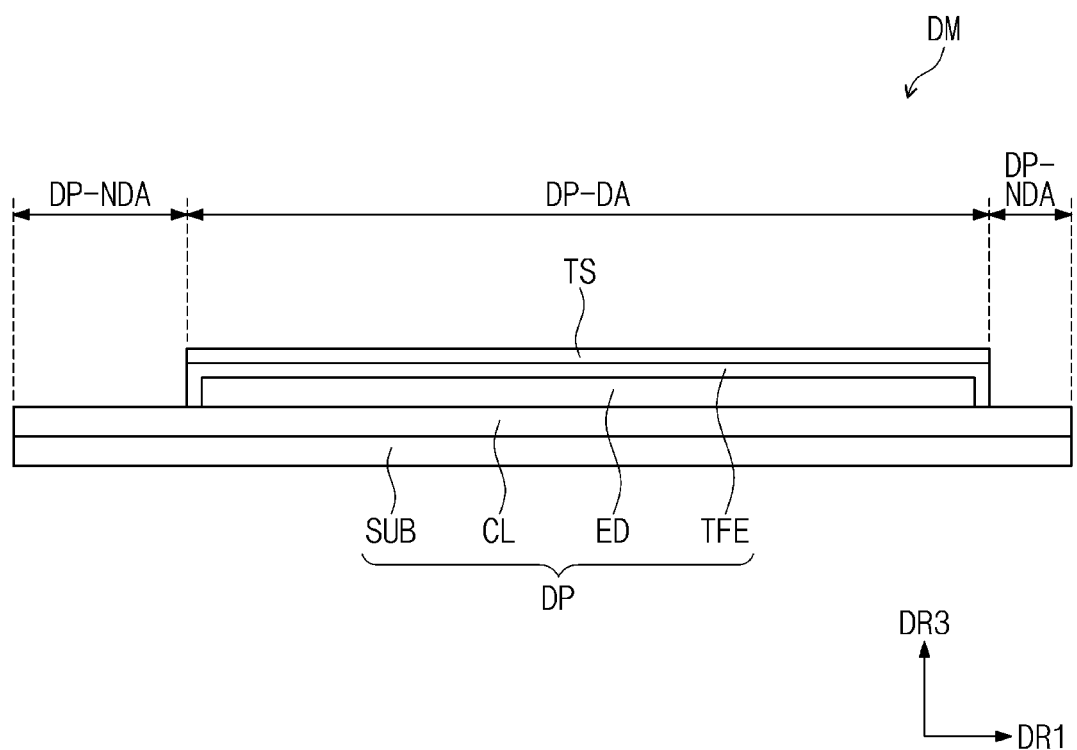
FIG. 2 is a cross-sectional view illustrating a display device according to an exemplary embodiment of the present disclosure.
Figure 3:
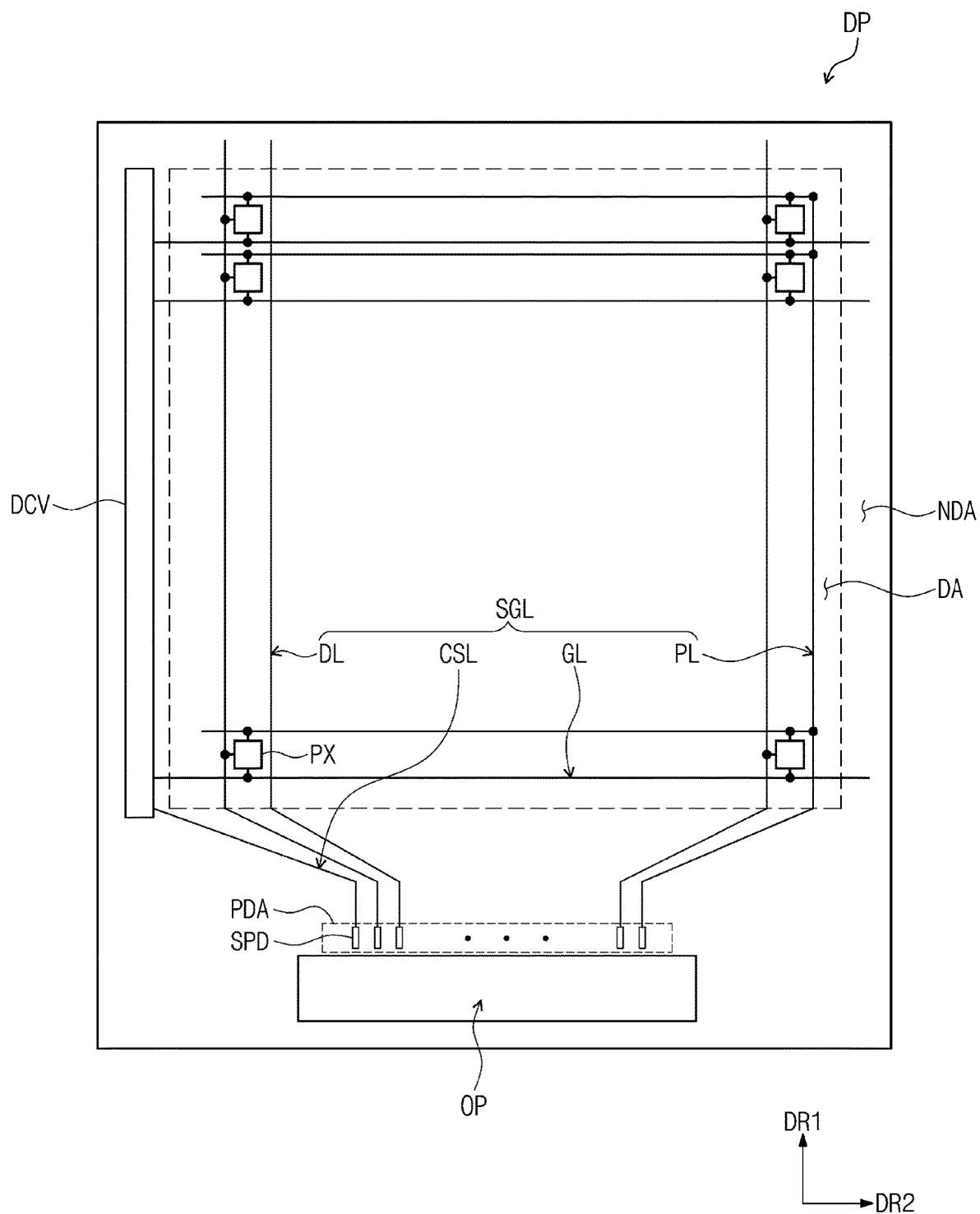
FIG. 3 is a plan view illustrating a display panel according to an exemplary embodiment of the present disclosure.
Figure 4:
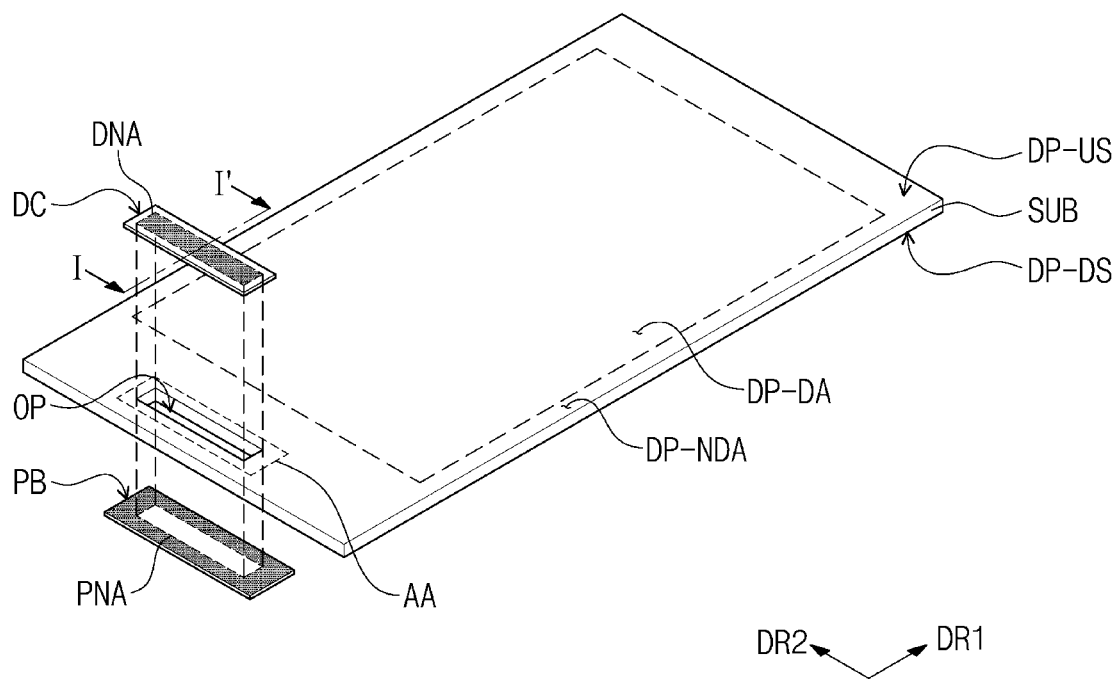
FIG. 4 is an exploded perspective view illustrating a base member according to an exemplary embodiment of the present disclosure.

It will be understood that when an element such as a layer, region or substrate is referred to as being "on" another element, it can be directly on the other element or intervening elements may be present. FIG. 1 is an exploded perspective view illustrating a display device according to an exemplary embodiment of the present disclosure. FIG. 2 is a cross-sectional view illustrating a display device according to an exemplary embodiment of the present disclosure. FIG. 3 is a plan view illustrating a display panel according to an exemplary embodiment of the present disclosure. FIG. 4 is an exploded perspective view illustrating a base member according to an exemplary embodiment of the present disclosure.

A display device DD that can be applied to a smart phone is illustrated as an exemplary embodiment of the present disclosure. However, embodiments of the invention are not limited thereto. In certain exemplary embodiments, the display device DD may be applied to various electronic devices such as a television or monitor, a personal computer, a notebook computer, a car satellite navigation unit, a portable game console, a smart speaker device, a smart watch, and a digital camera. However, the display device DD according to the present invention may also be applied to other electronic devices without departing the spirits and scopes of the invention.

According to exemplary embodiments of the present disclosure, the display device DD illustrated in FIG. 1 may be applied to a tablet personal computer, a smart phone, a personal digital assistant (PDA), a portable multimedia player (PMP), portable a game console, and/or a watch-type electronic device. In addition, the display device DD may also be applied to large-sized electronic devices (e.g., a television and/or an electronic billboard or jumbotron) and small and middle-sized electronic devices (e.g., a personal computer, a notebook computer, a car satellite navigation unit, and/or a digital camera).

In particular, the display device DD according to exemplary embodiments of the present disclosure may be installed in transport means such as a car, an airplane, and/or a ship. However, the display device DD according to the present invention may also be applied to other electronic devices without departing the spirits and scopes of the invention.

The display device DD includes a plurality of areas defined on or in a display surface. Here, the display surface may correspond to one surface of the display device, upon which an image is directly displayed. The display device DD includes a display area DA and a non-display area NDA that is adjacent to the display area DA. An image is displayed in the display area DA. In an exemplary embodiment of the present disclosure, the non-display area NDA may surround the display area DA. In other exemplary embodiments of the present disclosure, the non-display area NDA may be adjacent to a portion of the display area DA or may be omitted entirely.

Referring to FIG. 1, the display device DD may include a window member WM, a display module DM, a first circuit substrate DC, and a second circuit substrate PB, and a receiving member or case BC.

The window member WM may be disposed on the display module DM and may transmit an image, provided from the display module DM, through a display area DA. For example, the window member WM may be formed of glass, sapphire, plastic, or another transparent material. The window member WM may include the display area DA and a non-display area NDA which overlap with the display area DA and the non-display area NDA of the display device DD described above, respectively.

In FIG. 1, the window member WM is a single layer. However, embodiments of the present disclosure are not limited thereto. In certain exemplary embodiments, the window member WM may include a plurality of layers. For example, the window member WM may include a base layer, and at least one bezel layer disposed on a bottom surface of the base layer to correspond to the non-display area NDA.

The display module DM is arranged along a plane defined by a first direction DR1 and a second direction DR2. A normal direction of the display module DM is indicated by a third direction DR3. The third direction DR3 indicates a thickness direction of the display device DD. A top surface (or a front surface) and a bottom surface (or a back surface) of each of the members are defined with respect to the third direction DR3. However, the directions DR1, DR2, and DR3 may be relative concepts and may be changed into other directions.

The display module DM is disposed between the window member WM and the receiving member BC. The display module DM includes a display panel DP and a touch sensing member TS. The touch sensing member TS may be disposed between the window member WM and the display panel DP.

According to exemplary embodiments of the present disclosure, the display panel DP may be an organic light-emitting diode display panel, a liquid crystal display panel, a plasma display panel, an electrophoretic display panel, a microelectromechanical system (MEMS) display panel, an electrowetting display panel, or a comparable display panel.

Hereinafter, the display panel DP of the organic light-emitting diode display panel will be described as an example. However, embodiments of the invention are not limited thereto. In certain exemplary embodiments of the present disclosure, at least one of various display panels may be applied.

The display panel DP may generate an image and may provide the image to the window member WM. The display panel DP may include a display area DA and a non-display area NDA. The window member WM may overlap with the display area DA and the non-display area NDA of the display device DD.

The touch sensing member TS obtains coordinate information of an external input (e.g. touch). The touch sensing member TS may be disposed directly on the display panel DP. According to an exemplary embodiment of the present disclosure, the touch sensing member TS may be integrally formed with the display panel DP by continuous processes.

The display module DM, according to an exemplary embodiment of the present disclosure, may further include an anti-reflection layer. The anti-reflection layer may include a color filter, a stack structure of a conductive layer/a dielectric layer/a conductive layer, or an optical member. The anti-reflection layer may absorb, destructively interfere with or polarize external light incident from the outside to reduce a reflectance of the external light and to increase viewability of the display device DD, particularly when used in the presence of direct sunlight.

The first circuit substrate DC may overlap with the non-display area NDA and may be disposed on the display panel DP. The first circuit substrate DC may transfer a plurality of control signals and a plurality of image voltages, which are used to generate an image, to the display panel DP. The first circuit substrate DC may be a driving circuit substrate that generates the image voltages, which will be provided to pixels of the display panel DP, in response to externally provided image signals.

The second circuit substrate PB may overlap with the non-display area NDA and the first circuit substrate DC and may be disposed under the display panel DP. The second circuit substrate PB may transfer a plurality of control signals and a plurality of image signals, which are necessary to generate an image, to the first circuit substrate DC. The first circuit substrate DC may generate the image voltages, which will be provided to the display panel DP, in response to the image signals. The second circuit substrate PB may be a main circuit substrate that is connected to external devices (e.g., a graphic card) to receive the image signals.

According to exemplary embodiments of the present disclosure, at least one opening may be defined in the non-display area NDA of the display panel DP. The first circuit substrate DC may cover the opening and may be disposed in the non-display area NDA of the display panel DP. The second circuit substrate PB may cover the opening and may be disposed in the non-display area NDA of the display panel DP. In this case, the first circuit substrate DC and the second circuit substrate PB may be connected to each other through connection pins disposed in the opening.

In some display devices, an additional flexible circuit substrate for electrically connecting the first and second circuit substrates DC and PB may be used. Therefore, a space in which the flexible circuit substrate is disposed may be reserved, and thus a total non-display area of a display device may be increased.

However, in the display device DD according to exemplary embodiments of the present disclosure, the first and second circuit substrates DC and PB are connected to each other through the connection pins disposed in the opening, and thus an additional flexible circuit substrate is not required. As a result, the non-display area NDA can be reduced in the display device DD, as is described in greater detail below.

The receiving member BC may be disposed under the display module DM to receive the display module DM.

Referring to FIG. 2, the display panel DP includes a base member SUB, a circuit member CL, a display element ED, and a sealing member TFE.

The base member SUB may include a display area DP-DA and a non-display area DP-NDA adjacent to the display area DP-DA. The display area DP-DA and the non-display area DP-NDA of the base member SUB may be substantially the same as the display area DA and the non-display area NDA of the display device DD illustrated in FIG. 1. However, the display area DP-DA and the non-display area DP-NDA of the base member SUB might not need to be the same as the display area DA and the non-display area NDA of the display device DD but may be changed according to a structure and/or a design of the display panel DP. An exemplary embodiment of the present disclosure in which the display area DP-DA and the non-display area DP-NDA of the base member SUB are substantially the same as the display area DA and the non-display area NDA of the display device DD of FIG. 1 will be described hereinafter.

The base member SUB may include at least one plastic film. The base member SUB, according to an exemplary embodiment of the present disclosure, may be a flexible substrate and may include a plastic substrate or an organic/inorganic composite substrate.

The circuit member CL may be disposed on the base member SUB. The circuit member CL may overlap with the display area DP-DA and the non-display area DP-NDA of the base member SUB. The display element ED may be disposed on the circuit member CL and may overlap with the display area DP-DA.

For example, the circuit member CL may include a plurality of insulating layers, a plurality of conductive layers, and a semiconductor layer. The plurality of conductive layers may include signal lines and/or a circuit part of a pixel. The display element ED may include a plurality of organic light-emitting diodes (OLEDs).

The sealing member TFE may seal the display element ED. For example, the sealing member TFE may be a thin film sealing layer. In this case, the sealing member TFE may include an inorganic layer and an organic layer. For example, the sealing member TFE may include at least two inorganic layers and an organic layer disposed between the inorganic layers. The inorganic layers may protect a light-emitting element layer from moisture and/or oxygen, and the organic layer protects the light-emitting element layer from foreign materials such as dust particles. The inorganic layer may include a silicon nitride layer, a silicon oxynitride layer, a silicon oxide layer, a titanium oxide layer, and/or an aluminum oxide layer. The organic layer may include, but is not limited to, an acrylic-based organic layer.

In an exemplary embodiment of the present disclosure, the sealing member TFE may be a sealing substrate. In this case, the sealing substrate may be a plastic substrate, a flexible plastic substrate, or a glass substrate.

According to exemplary embodiments of the present disclosure, the touch sensing member TS may be single-layered. For example, the touch sensing member TS may include a single conductive layer. Here, the single conductive layer may be a continuous conductive layer separated by an insulating layer. A stack structure of a first metal layer/a second metal layer/a metal oxide layer corresponds to the single conductive layer, and a stack structure of a metal layer/an insulating layer/a metal oxide layer corresponds to a double conductive layer.

The single conductive layer is patterned to form a plurality of touch electrodes and a plurality of touch signal lines. For example, sensors (e.g., the touch electrodes) of the touch sensing member TS are disposed on the same layer. The sensors may be disposed directly on the sealing member TFE. In addition, a portion of each of the touch signal lines is disposed on the same layer as the sensors. The portion of each of the touch signal lines may be disposed on the circuit member CL.

In some exemplary embodiments of the present disclosure, the touch signal lines and the sensors may include indium-tin oxide (ITO), indium-zinc oxide (IZO), zinc oxide (ZnO), indium-tin-zinc oxide (ITZO), PEDOT, a metal nanowire, and/or graphene. In some exemplary embodiments of the present disclosure, the touch signal lines and the sensors may include a metal layer, e.g., molybdenum, silver, titanium, copper, aluminum, or any alloy thereof. The touch signal lines and the sensors may include the same material or materials different from each other.

The touch sensing member TS of the single conductive layer is described above. However, the invention is not limited to having a single conductive layer touch sensing member TS. In certain exemplary embodiments of the present disclosure, the touch sensing member TS may include a plurality of conductive layers.

Referring to FIG. 3, the display panel DP includes a plurality of signal lines SGL and a plurality of pixels PX. An area in which the plurality of pixels PX is disposed is defined as the display area DA. For example, the non-display area NDA may be defined along a border of the display area DA.

The plurality of signal lines SGL may include gate lines GL, data lines DL, a power line PL, and a control signal line CSL. Each of the gate lines GL is connected to corresponding ones of the plurality of pixels PX, and each of the data lines DL is connected to corresponding ones of the plurality of pixels PX. The power line PL is connected to the plurality of pixels PX. A gate driving circuit DCV to which the gate lines GL are connected may be disposed in one side portion of the non-display area NDA. The control signal line CSL may provide control signals to the gate driving circuit DCV.

One or some of the gate lines GL, the data lines DL, the power line PL and the control signal line CSL may be disposed in a first layer, and another or others of the gate lines GL, the data lines DL, the power line PL and the control signal line CSL may be disposed in a second layer different from the first layer. The signal lines, disposed in the first layer, of the gate lines GL, the data lines DL, the power line PL and the control signal line CSL may be defined as first signal lines, and the signal lines disposed in the second layer may be defined as second signal lines. The signal lines disposed in s third layer may be defined as third signal lines.

In addition, the display panel DP may include a signal pad area PDA overlapping with the non-display area NDA. A plurality of signal pads SPD may be disposed in the signal pad area PDA. The signal pads SPD may be connected to ends of signal interconnection portions respectively connected to the data lines DL, the power line PL, and the control signal line CSL. Here, portions of the signal interconnection portions and the signal pads SPD may overlap with the non-display area NDA. The signal interconnection portions may be defined as portions of the data lines DL, the power line PL and the control signal line CSL, which overlap with the non-display area NDA.

The signal pads SPD may be in contact with the first circuit substrate DC and may transfer electrical signals provided from the first circuit substrate DC to the data lines DL, the power line PL and the control signal line CSL. In addition, gate pad portions may overlap with the gate driving circuit DCV and may be connected to the gate driving circuit DCV.

As illustrated in FIGS. 3 and 4, the display panel DP, according to exemplary embodiments of the present disclosure, may include at least one opening OP defined in the non-display area NDA. The first circuit substrate DC may cover the opening OP and may be disposed on a top surface DP-US of the display panel DP. For example, data pads included in the first circuit substrate DC may be in contact with the signal pads SPD disposed in the signal pad area PDA. As a result, the electrical signals outputted from the first circuit substrate DC may be transmitted to the signal pads SPD through the data pads. The second circuit substrate PB may cover the opening OP and may be disposed on a bottom surface DP-DS of the display panel DP.

The first circuit substrate DC includes a first connection area DNA overlapping with the opening OP, and the second circuit substrate PB includes a second connection area PNA overlapping with the opening OP. The first connection area DNA and the second connection area PNA may face each other through the opening OP. A plurality of connection pins PN (see FIG. 5B) may be disposed on the second connection area PNA of the second circuit substrate PB. The connection pins PN may be disposed in the opening OP to connect the first circuit substrate DC and the second circuit substrate PB to each other, for example, as is discussed in further detail below.

Figure 5A:
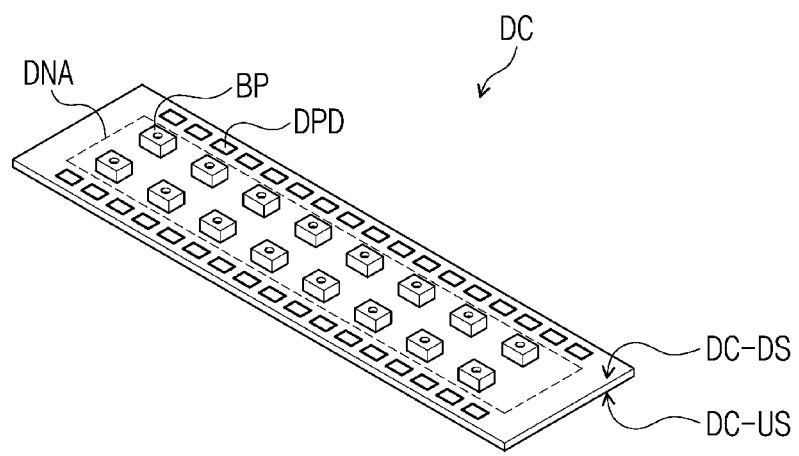
FIG. 5A is a perspective view illustrating a first circuit substrate of FIG. 4.
Figure 5B:
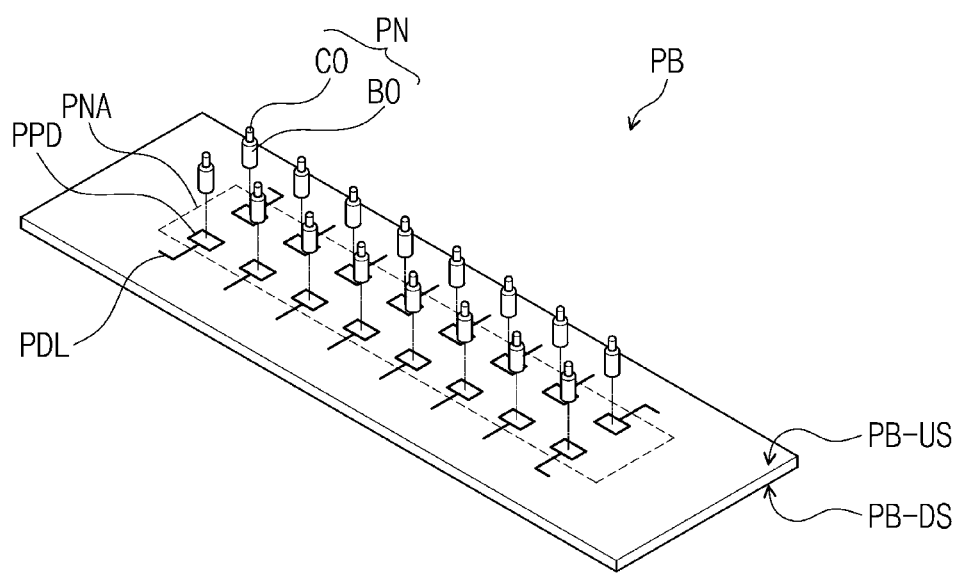
FIG. 5B is a perspective view illustrating a second circuit substrate of FIG. 4.

FIG. 5A is a perspective view illustrating a first circuit substrate of FIG. 4. FIG. 5B is a perspective view illustrating a second circuit substrate of FIG. 4.

Referring to FIGS. 4 and 5A, the first circuit substrate DC includes a first top surface DC-US and a first bottom surface DC-DS facing the top surface DP-US of the display panel DP. The first circuit substrate DC may include a plurality of bumps BP that overlap with the first connection area DNA and are disposed on the first bottom surface DC-DS. The bumps BP may be electrically conductive and may be, for example, solder bumps.

The bumps BP are illustrated in FIG. 5A as having a quadrilateral shape, however, the bumps may be formed to have any shape. For example, the bumps BP may have circular, semicircular, or triangular shapes when viewed in a plan view. In addition, the number of the bumps BP disposed on the first bottom surface DC-DS may be variously changed.

According to some exemplary embodiments of the present disclosure, each of the bumps BP may include a concave region. The concave region of each of the bumps BP may be coupled to an end of each of the connection pins PN disposed on the second circuit substrate PB. In FIG. 5A, the bumps BP having the concave regions are illustrated as an example. Alternatively, the bumps BP might not include the concave regions but may be coupled to the connection pins PN. For example, the shapes of the bumps BP connected to the ends of the connection pins PN may be variously modified.

The first circuit substrate DC may include data pads DPD disposed on the other area except the first connection area DNA. The data pads DPD may be in contact with the signal pads SPD disposed on the top surface DP-US of the display panel DP. For example, when the first circuit substrate DC covers the opening OP and is disposed on the top surface DP-US, the data pads DPD may be in contact with the signal pads SPD.

The first circuit substrate DC may include a driving integrated circuit (IC) that is electrically connected to the bumps BP to receive electrical signals outputted from the second circuit substrate PB. The driving IC may also be electrically connected to the data pads DPD to provide the control signals and the image voltages to the data pads DPD. Thus, the signals outputted from the driving IC may be transmitted to the signal pads SPD, disposed on the top surface DP-US of the display panel DP, through the data pads DPD.

Referring to FIGS. 4 and 5B, the second circuit substrate PB includes a second top surface PB-US facing the bottom surface DP-DS of the display panel DP, and a second bottom surface PB-DS opposite to the second top surface PB-US. The second circuit substrate PB includes a plurality of output pads PPD overlapping with the second connection area PNA and disposed on the second top surface PB-US, and signal lines PDL electrically connected to the output pads PPD, respectively. The signal lines PDL may be electrically connected to driving chips disposed on the second circuit substrate PB. For example, the driving chips may include a power supply and a signal control part generating the control signals and the image voltages to be provided to the display panel DP.

According to some exemplary embodiments of the present disclosure, the connection pins PN may be connected to or in contact with top surfaces of the output pads PPD, respectively. In some exemplary embodiments of the present disclosure, the connection pins PN may be in electrical contact with the output pads PPD through solder. However, the invention is not limited to this particular configuration. In some exemplary embodiments of the present disclosure, the connection pins PN may be coupled to the second top surface PB-US by a connector method.

For example, each of the connection pins PN includes a body portion BO connected to or being in contact with each of the output pads PPD, and a coupling portion CO connected onto the body portion BO. In some exemplary embodiments of the present disclosure, the connection pins PN may be pogo pins or may otherwise be spring-loaded or otherwise able to provide a restorative force when compressed. The body portion BO and the coupling portion CO may constitute one body or may be divided from each other. When the body portion BO and the coupling portion CO are divided from each other, the coupling portion CP may be partially inserted in the body portion BO by pressure applied to the coupling portion CO. The coupling portions CO of the connection pins PN may be inserted in the aforementioned concave regions of the bumps BP disposed on the first circuit substrate DC, respectively.

Figure 6A:
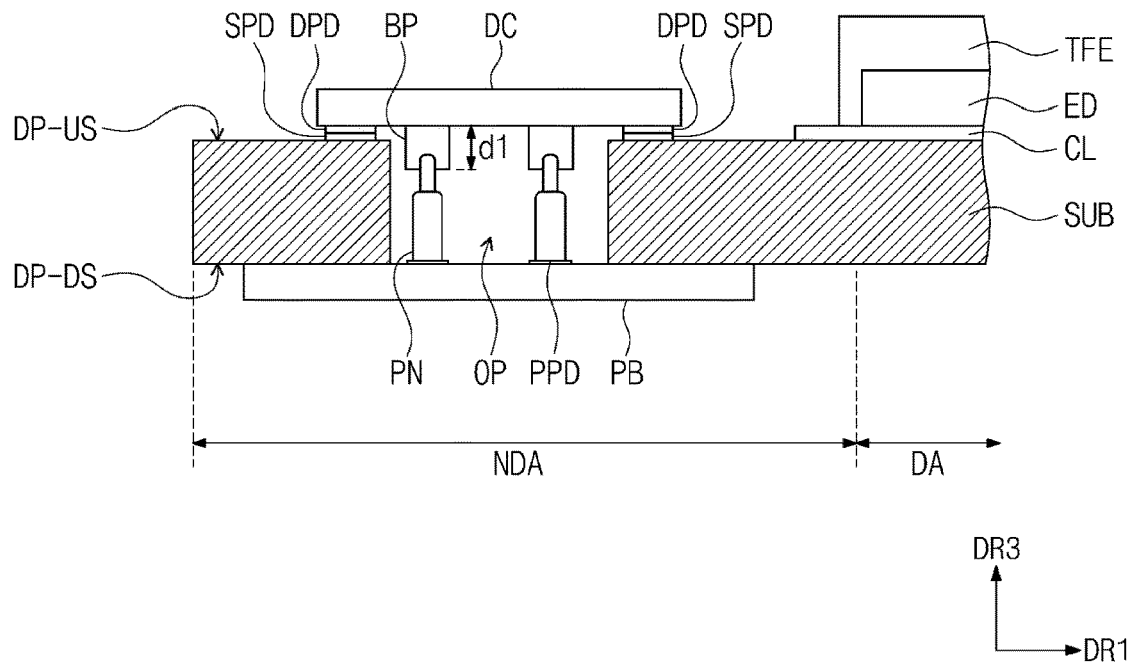
FIG. 6A is a cross-sectional view taken along a line I-I' of FIG. 4 according to an exemplary embodiment of the present disclosure.

FIG. 6A is a cross-sectional view taken along a line I-I' of FIG. 4 according to an exemplary embodiment of the present disclosure.

Referring to FIG. 6A, the first circuit substrate DC covers the opening OP, overlaps with the non-display area NDA, and is disposed on the top surface DP-US. The second circuit substrate PB covers the opening OP, overlaps with the non-display area NDA, and is disposed on the bottom surface DP-DS.

The data pads DPD disposed on the first circuit substrate DC may be in contact with the signal pads SPD disposed on the top surface DP-US. In this case, as illustrated in FIG. 6A, the signal pads SPD may be disposed on the top surface DP-US to surround the opening OP in a plan view. For example, the signal pads SPD illustrated in FIG. 3 may be arranged to surround the opening OP.

The connection pins PN may be connected to or in contact with the top surfaces of the output pads PPD disposed on the second circuit substrate PB. For example, first ends of the connection pins PN may be connected to the output pads PPD, and second ends (e.g. opposite to the first ends) of the connection pins PN may be connected to the bumps BP.

According to the above descriptions, the electrical signals outputted from the second circuit substrate PB may be transmitted to the first circuit substrate DC through the output pads PPD, the connection pins PN, and the bumps BP. In addition, the electrical signals transmitted to the first circuit substrate DC may be transmitted to the circuit member CL through the data pads DPD and the signal pads SPD.

According to some exemplary embodiments of the present disclosure, thicknesses d1 of the bumps BP in the third direction DR3 may be greater than thicknesses of the data pads DPD in the third direction DR3. For example, the bumps BP may have structures of which portions are disposed in the opening OP so as to be connected to the connection pins PN. As a result, the thicknesses d1 of the bumps BP may be different from the thicknesses of the data pads DPD. In an exemplary embodiment of the present disclosure, the thickness d1 of the bump BP may be greater than a sum of the thickness of the data pad DPD and a thickness of the signal pad SPD in the third direction DR3.

Figure 6B:
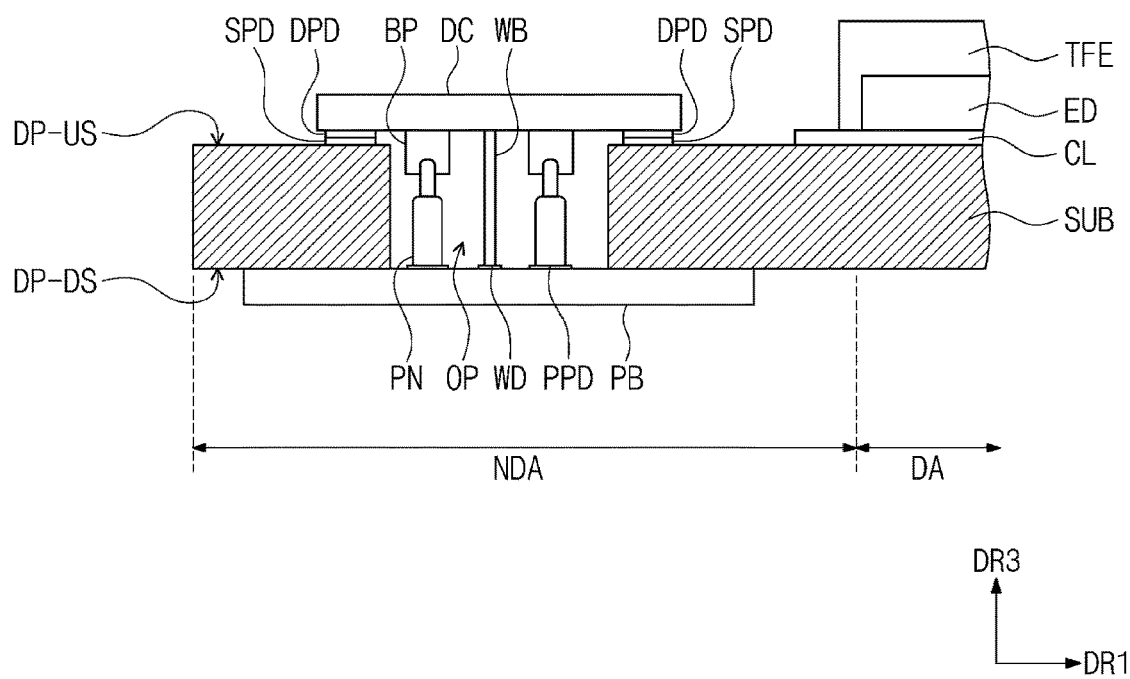
FIG. 6B is a cross-sectional view taken along the line I-I' of FIG. 4 according to an exemplary embodiment of the present disclosure.

FIG. 6B is a cross-sectional view taken along the line I-I' of FIG. 4 according to an exemplary embodiment of the present disclosure.

Referring to FIG. 6B, a display device of FIG. 6B may further include a dummy bump WB as compared with the display device of FIG. 6A, and other components of the display device of FIG. 6B may be substantially the same as corresponding ones of the display device of FIG. 6A. Thus, elements that are not described may be assumed to be at least similar to corresponding elements that have already been described.

Referring to FIG. 6B, the dummy bump WB separating the connection pins PN from each other may be disposed between the first circuit substrate DC and the second circuit substrate PB. For example, the dummy bump WB may be disposed in the opening OP. The dummy bump WB may be disposed between the connection pins PN. In an exemplary embodiment of the present disclosure, one end of the dummy bump WB may be connected to the first circuit substrate DC, and another end of the dummy bump WB may be connected to the second circuit substrate PB. However, the structure of the dummy bump WB may be variously modified. For example, the dummy bump WB may be connected to one of the first circuit substrate DC and the second circuit substrate PB.

The second circuit substrate PB may further include a dummy pad WD, and the dummy bump WB may be disposed on the dummy pad WD. The dummy pad WD may receive a ground voltage provided from the second circuit substrate PB. The ground voltage provided to the dummy pad WD is transmitted to the dummy bump WB.

Since the dummy bump WB is disposed to separate the connection pins PN from each other as described above, a coupling phenomenon between the connection pins PN may be reduced or minimized. Thus, the electrical signals outputted from the second circuit substrate PB may be transmitted to the first circuit substrate DC without signal distortion.

The dummy pad WD is disposed on the second circuit substrate PB in the above descriptions. However, the invention is not limited to this particular configuration. In an exemplary embodiment of the present disclosure, the dummy pad WD may be disposed on the first circuit substrate DC and may provide the ground voltage to the dummy bump WB.

Figure 7:
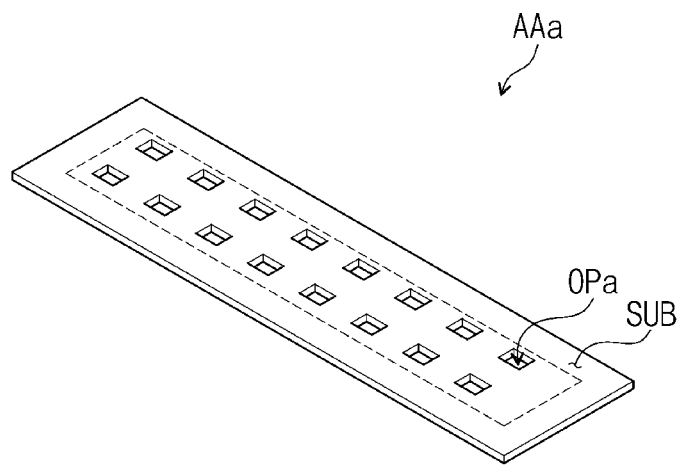
FIG. 7 is an enlarged view of an area 'AA' of FIG. 4 according to an exemplary embodiment of the present disclosure.
Figure 8:
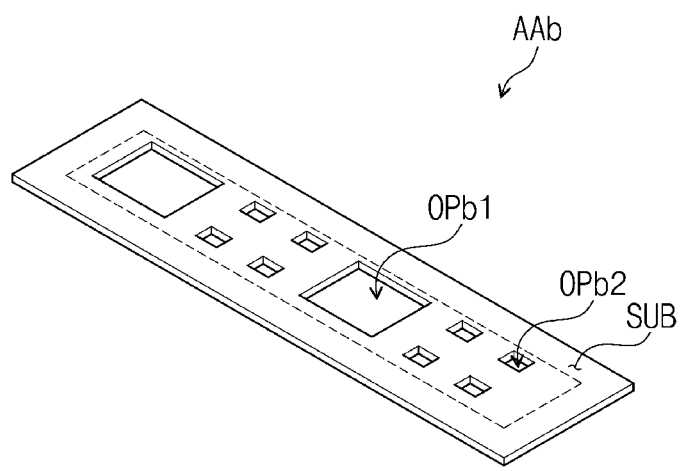
FIG. 8 is an enlarged view of the area 'AA' of FIG. 4 according to an exemplary embodiment of the present disclosure.

FIG. 7 is an enlarged view of an area 'AA' of FIG. 4 according to an exemplary embodiment of the present disclosure. FIG. 8 is an enlarged view of the area 'AA' of FIG. 4 according to an exemplary embodiment of the present disclosure.

Referring to FIG. 7, a plurality of openings OPa may be defined in the non-display area NDA. The openings OPa may be defined in a first area AAa of the non-display area NDA. According to an exemplary embodiment of the present disclosure, the number of the openings OPa may be equal to the number of the connection pins PN illustrated in FIG. 5B. In this case, the connection pins PN may be disposed in the openings OPa, respectively. In addition, the number of the openings OPa may be equal to the number of the bumps BP illustrated in FIG. 5A. In this case, the connection pins PN may be connected to the bumps BP, respectively.

Referring to FIG. 8, a plurality of openings may be defined in the non-display area NDA. The openings may be defined in a second area AAb of the non-display area NDA. According to some exemplary embodiments of the present disclosure, the openings may include a first opening OPb1 and a second opening OPb2, which have different sizes from each other. For example, a shape of the first opening OPb1 may be different from a shape of the second opening OPb2.

For example, a plurality of connection pins may be disposed in the first opening OPb1, and one connection pin may be disposed in the second opening OPb2. In this case, the connection pins disposed in the first opening OPb1 may transmit image signals, and the connection pin disposed in the second opening OPb2 may transmit control signals. However, this embodiment is described as an example, and the invention is not limited to this particular arrangement. In certain exemplary embodiments of the present disclosure, various signals may be provided to the connection pins disposed in the first and second openings OPb1 and OPb2.

Figure 9:
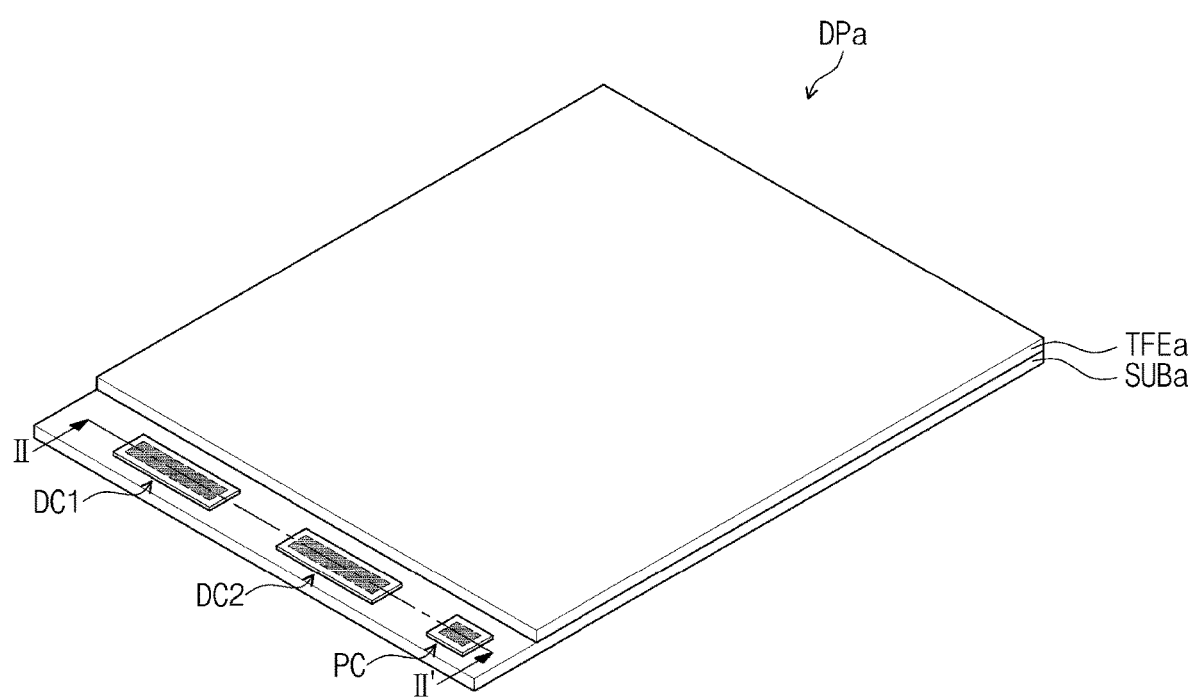
FIG. 9 is a perspective view illustrating a display panel according to an exemplary embodiment of the present disclosure.

FIG. 9 is a perspective view illustrating a display panel according to an exemplary embodiment of the present disclosure. FIG. 10A is a cross-sectional view taken along a line II-II' of FIG. 9 according to an exemplary embodiment of the present disclosure. FIG. 10B is a cross-sectional view taken along the line II-II' of FIG. 9 according to an exemplary embodiment of the present disclosure.

Referring to FIG. 9, a display panel DPa further includes a third circuit substrate DC2 and a fourth circuit substrate PC, as compared with the display panel DP illustrated in FIG. 4. For example, a first circuit substrate DC1 and a second circuit substrate PB may be substantially the same as the first circuit substrate DC and the second circuit substrate PB described with reference to FIG. 4, and thus the descriptions thereto will be omitted.

For example, referring to FIGS. 9 and 10A, a first opening OP1, a second opening OP2, and a third opening OP3 may be defined in the non-display area NDA of the display panel DPa. Sizes of the first to third openings OP1 to OP3 may be equal to each other, or the size of one or some of the first to third openings OP1 to OP3 may be different from that of another or others of the first to third openings OP1 to OP3.

The first circuit substrate DC1 may be connected to the second circuit substrate PB through first connection pins PN1 disposed in the first opening OP1. In this case, the first circuit substrate DC1 may include first bumps BP1 connected to first ends of the first connection pins PN1. The second circuit substrate PB may include first output pads PPD1 connected to second ends of the first connection pins PN1.

The first circuit substrate DC1 may be electrically connected to a circuit member of the display panel DPa through first pads PD1. The first pads PD1 may include data pads disposed on the first circuit substrate DC1 and signal pads disposed on the top surface of the display panel DPa, as described above with reference to FIG. 6A. For example, the first circuit substrate DC1 may be a driving circuit substrate that provides image voltages to first data lines of the data lines DL (see FIG. 3).

The third circuit substrate DC2 may be connected to the second circuit substrate PB through second connection pins PN2 disposed in the second opening OP2. In this case, the third circuit substrate DC2 may include second bumps BP2 connected to first ends of the second connection pins PN2. The second circuit substrate PB may include second output pads PPD2 connected to second ends of the second connection pins PN2.

In addition, the third circuit substrate DC2 may be electrically connected to the circuit member of the display panel DPa through second pads PD2. The second pads PD2 may include data pads disposed on the third circuit substrate DC2 and signal pads disposed on the top surface of the display panel DPa. For example, the third circuit substrate DC2 may be a driving circuit substrate that provides image voltages to second data lines corresponding to the others of the data lines DL except the first data lines.

The fourth circuit substrate PC may be connected to the second circuit substrate PB through third connection pins PN3 disposed in the third opening OP3. In this case, the fourth circuit substrate PC may include third bumps BP3 connected to first ends of the third connection pins PN3. The second circuit substrate PB may include third output pads PPD3 connected to second ends of the third connection pins PN3.

In addition, the fourth circuit substrate PC may be electrically connected to the circuit member of the display panel DPa through third pads PD3. The third pads PD3 may include control pads disposed on the fourth circuit substrate PC and signal pads disposed on the top surface of the display panel DPa. The fourth circuit substrate PC may be a circuit substrate including at least one driving chip that generates power and control signals necessary for overall operations of the display device DD. For example, the fourth circuit substrate PC may include a signal driving chip generating image signals and a power driving chip providing a power control signal.

According to the above descriptions, the second circuit substrate PB may cover the first to third openings OP1 to OP3 and may be disposed on a bottom surface of the display panel DPa.

At least one of the first pads PD1 may be electrically connected to at least one of the second pads PD2 through at least one first connection pad CPD1. At least one of the second pads PD2 may be electrically connected to at least one of the third pads PD3 through at least one second connection pad CPD2. As a result, the first circuit substrate DC1, the third circuit substrate DC2, and the fourth circuit substrate PC may be electrically connected to each other.

Referring to FIG. 10B, the second opening OP2, the second bumps BP2, the second output pads PPD2, and the second connection pads PN2 may be omitted in a display panel illustrated in FIG. 10B, unlike the display panel of FIG. 10A. Other components of the display panel of FIG. 10B may be substantially the same as corresponding ones of the display panel of FIG. 10A.

For example, the first circuit substrate DC1 receives the electrical signals from the second circuit substrate PB through the first connection pins PN1. In this case, the first connection pins PN1 may include at least one connection pin receiving an electrical signal which will be provided to the third circuit substrate DC2. Since the first pad PD1 is connected to the second pad PD2 through a first connection pad CPD1*a*, the electrical signal received through the first connection pins PN1 may be transmitted to the third circuit substrate DC2. In addition, since the second pad PD2 is connected to the third pad PD3 through a second connection pad CPD1*b*, the power and control signal provided through the third connection pins PN3 may be transmitted to the third circuit substrate DC2.

According to exemplary embodiments of the present disclosure, the driving circuit substrate and the main circuit substrate may be electrically connected to each other through the opening defined in the base member. In this case, the main circuit substrate and the driving circuit substrate may be electrically connected to each other through the connection pins inserted in the opening.

For example, a general connection circuit substrate for connecting main and driving circuit substrates may be omitted to reduce or remove a space in which the connection circuit substrate is disposed. Thus, the non-display area of the display device may be reduced.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device comprising:
    a base substrate including a display area and a non-display area adjacent to the display area, the non-display area having an opening disposed therein;
    a circuit member disposed on the base substrate within the display area and the non-display area;
    a display element disposed on the circuit member and overlapping the display area;
    a sealing member disposed over the display element;
    a first circuit substrate disposed on the base substrate and overlapping with the non-display area, the first circuit substrate covering the opening and comprising a plurality of bumps overlapping the opening;

a second circuit substrate disposed under the base substrate and overlapping with the first circuit substrate, the second circuit substrate covering the opening and comprising a plurality of output pads overlapping the bumps, respectively; and a plurality of connection pins disposed in the opening and configured to connect the bumps to the output pads, respectively, wherein each of the plurality of connection pins are disposed within the opening without any structure being disposed between neighboring connection pins of the plurality of connection pins.

2. The display device of claim 1, wherein the bump includes a concave region and the connection pin is disposed within the concave region of the bump.

3. The display device of claim 1, wherein the first circuit substrate further comprises: a plurality of data pads disposed on the base substrate.

4. The display device of claim 3, wherein a thickness of each of the bumps is greater than thicknesses of the data pads.

5. The display device of claim 3, further comprising: a plurality of signal pads disposed on the base substrate and contacting the data pads.

6. The display device of claim 1, wherein the opening is one of a plurality of openings, and wherein at least two of the plurality of openings have different sizes from each other.

7. The display device of claim 6, wherein the connection pin includes a plurality of connection pins disposed in the two of the plurality of openings, and wherein the number of the connection pins disposed in one of the two of the plurality of openings is different from the number of the connection pins disposed in the other of the two of the plurality of openings.

8. The display device of claim 1, further comprising: a third circuit substrate disposed on the base substrate and overlapping with the non-display area.

9. The display device of claim 8, wherein the non-display area further includes a second opening overlapping with the third circuit substrate, wherein the second circuit substrate is disposed under the base substrate and covers the second opening, and wherein the third circuit substrate is disposed on the base substrate and covers the second opening.

10. The display device of claim 9, further comprising: a plurality of second connection pins disposed in the second opening and connecting the second circuit substrate to the third circuit substrate.

11. The display device of claim 8, further comprising: a connection pad disposed on the base substrate and overlapping the non-display area, the connection pad connecting the first circuit substrate to the third circuit substrate.

12. The display device of claim 1, further comprising: a touch sensing member disposed on the sealing member.

13. The display device of claim 1, wherein the first circuit substrate establishes a plurality of electrical connections with the base substrate by a contacting of a plurality of data pads of the first circuit substrate with a plurality of signal pads of the base substrate and the plurality of connection pins are disposed between electrical connections of the plurality of electrical connections of the base substrate and the first circuit substrate.

14. A display device comprising:

a base substrate defining a plurality of openings;

a plurality of signal pads disposed on a top surface of the base substrate;

a first circuit substrate disposed above the base substrate and comprising a plurality of bumps, at least two bumps of the plurality of bumps are disposed in each of the openings, the first circuit substrate further comprising a plurality of data pads disposed on a bottom surface thereof;

a second circuit substrate disposed under the base substrate and comprising a plurality of output pads respectively overlapping the bumps, at least two output pads of the plurality of output pads are disposed in the each of the openings; and at least two connection pins disposed in the each of the openings and configured to connect the bumps to the output pads, respectively, wherein the first circuit substrate establishes a plurality of electrical connections with the base substrate by the contacting of the plurality of data pads of the first circuit substrate with the plurality of signal pads of the base substrate and the at least two connection pins are disposed between electrical connections of the plurality of electrical connections of the base substrate and the first circuit substrate without any structure being disposed between the at least two connection pins.

15. A display device, comprising:

a bottom substrate comprising a hole;

a top substrate disposed over the bottom substrate and comprising a display area configured to display an image; and a base substrate disposed below the bottom substrate, wherein the base substrate includes a plurality of spring-loaded pins for delivering signals to drive the display area and the plurality of pins are disposed within the hole of the bottom substrate so as to connect the display area to the base substrate through the hole in the bottom substrate with the plurality of spring-loaded pins, wherein each of the plurality of spring-loaded pins are disposed within the hole of the bottom substrate without any structure being disposed between neighboring spring-loaded pins of the plurality of spring-loaded pins.

16. The display device of claim 15, wherein the top substrate further includes a non-display area that is configured to receive the signals from the plurality of pins and direct the signals to the display area.

17. The display device of claim 15, wherein each of the plurality of pins is a pogo pin.

18. The display device of claim 15, wherein the display area is entirely driven by the signals.

19. The display device of claim 15, wherein the top substrate establishes a plurality of electrical connections with the bottom substrate by a contacting of a plurality of data pads of the top substrate with a plurality of signal pads of the bottom substrate and the plurality of connection pins are disposed between electrical connections of the plurality of electrical connections of the bottom substrate and the top substrate.

* * * * *